United States Patent
Wang et al.

(10) Patent No.: US 10,488,903 B2
(45) Date of Patent: Nov. 26, 2019

(54) EXTENDED BASE OF MOBILE TERMINAL AND POWER SUPPLY MANAGEMENT METHOD FOR EXTENDED BASE

(71) Applicant: Huawei Technologies Co., Ltd., Shenzhen (CN)

(72) Inventors: Huiyuan Wang, Shenzhen (CN); Chao Fu, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 146 days.

(21) Appl. No.: 15/560,818

(22) PCT Filed: Mar. 24, 2015

(86) PCT No.: PCT/CN2015/074950
§ 371 (c)(1),
(2) Date: Sep. 22, 2017

(87) PCT Pub. No.: WO2016/149909
PCT Pub. Date: Sep. 29, 2016

(65) Prior Publication Data
US 2018/0113495 A1    Apr. 26, 2018

(51) Int. Cl.
*G06F 1/00* (2006.01)
*G06F 1/26* (2006.01)
(Continued)

(52) U.S. Cl.
CPC .............. *G06F 1/26* (2013.01); *H03K 17/94* (2013.01); *H04W 88/02* (2013.01)

(58) Field of Classification Search
None
See application file for complete search history.

(56) References Cited

U.S. PATENT DOCUMENTS

| 5,862,349 A * | 1/1999 | Cho ...................... G06F 1/1632 |
| | | 710/304 |
| 2003/0012186 A1* | 1/2003 | Rowe ................... H03K 17/063 |
| | | 370/362 |

(Continued)

FOREIGN PATENT DOCUMENTS

| CN | 101645056 A | 2/2010 |
| CN | 201662766 U | 12/2010 |

(Continued)

OTHER PUBLICATIONS

Machine Translation and Abstract of Japanese Publication No. JP2009223522, Oct. 1, 2009, 8 pages.

(Continued)

*Primary Examiner* — Nitin C Patel
(74) *Attorney, Agent, or Firm* — Conley Rose, P.C.

(57) ABSTRACT

An extended base of a mobile terminal and a power supply management method for the extended base is described herein. When a mobile terminal is inserted into an extended base, an enable circuit of the extended base is electrically connected to the mobile terminal and generates an enable signal, and a switch circuit outputs a voltage under control of the enable signal, so that a power supply of the extended base supplies power under control of the voltage. When the mobile terminal is removed from the extended base, the enable circuit stops generating the enable signal, and the switch circuit stops outputting the voltage, so that the power supply cannot supply power under the control of the voltage.

20 Claims, 4 Drawing Sheets

(51) Int. Cl.
*H04W 88/02* (2009.01)
*H03K 17/94* (2006.01)

(56) References Cited

U.S. PATENT DOCUMENTS

| | | | | |
|---|---|---|---|---|
| 2004/0245962 | A1* | 12/2004 | Xi | G01R 19/16542 320/134 |
| 2006/0181241 | A1* | 8/2006 | Veselic | G06F 1/266 320/107 |
| 2010/0036991 | A1 | 2/2010 | Lee | |
| 2012/0246350 | A1 | 9/2012 | Lee | |
| 2013/0237085 | A1 | 9/2013 | Kim et al. | |
| 2015/0011160 | A1 | 1/2015 | Jurgovan et al. | |
| 2015/0061575 | A1* | 3/2015 | Han | H02J 7/007 320/107 |

FOREIGN PATENT DOCUMENTS

| | | | |
|---|---|---|---|
| CN | 103444258 | A | 12/2013 |
| CN | 104267781 | A | 1/2015 |
| JP | 2009223522 | A | 10/2009 |
| JP | 2013544020 | A | 12/2013 |
| WO | 2008131486 | A1 | 11/2008 |
| WO | 2011083886 | A1 | 7/2011 |

OTHER PUBLICATIONS

Foreign Communication From a Counterpart Application, Japanese Application No. 2017-549610, Japanese Office Action dated Jul. 31, 2018, 2 pages.
Foreign Communication From a Counterpart Application, Japanese Application No. 2017-549610, English Translation of Japanese Office Action dated Jul. 31, 2018, 2 pages.
Machine Translation and Abstract of Chinese Publication No. CN104267781, Jan. 7, 2015, 14 pages.
Foreign Communication From a Counterpart Application, PCT Application No. PCT/CN2015/074950, English Translation of International Search Report dated Dec. 23, 2015, 2 pages.
Foreign Communication From a Counterpart Application, PCT Application No. PCT/CN2015/074950, English Translation of Written Opinion dated Dec. 23, 2015, 5 pages.
Foreign Communication From a Counterpart Application, European Application No. 15885848.0, Extended European Search Report dated Jan. 29, 2018, 14 pages.
Machine Translation and Abstract of Chinese Publication No. CN201662766, Dec. 1, 2010, 17 pages.
Foreign Communication From a Counterpart Application, Chinese Application No. 201580074073.8, Chinese Office Action dated Apr. 30, 2019, 7 pages.

* cited by examiner

When a mobile terminal is inserted into an extended base, a second connector is in contact with a first connector, a metal shield is connected to the second connector for grounding, an enable circuit is electrically connected to the mobile terminal and generates an enable signal, and a switch circuit outputs a voltage under control of the enable signal, so that under control of the voltage, the extended base enables a power supply to supply power

S72

When the mobile terminal is removed from the extended base, the second connector is out of contact with the first connector, the enable circuit is electrically disconnected from the mobile terminal and stops generating the enable signal, and the switch circuit stops outputting the voltage, so that under the control of the voltage, the extended base cannot enable the power supply to supply power

FIG. 7

EXTENDED BASE OF MOBILE TERMINAL AND POWER SUPPLY MANAGEMENT METHOD FOR EXTENDED BASE

CROSS-REFERENCE TO RELATED APPLICATIONS

This application is a national stage of International Application No. PCT/CN2015/074950, filed on Mar. 24, 2015, which is hereby incorporated by reference in its entirety.

TECHNICAL FIELD

The present disclosure relates to the field of power supply management technologies, and specifically, to an extended base of a mobile terminal and a power supply management method for the extended base.

BACKGROUND

As an auxiliary device of a wireless network terminal, an extended base has functions such as network interface extension and signal enhancement of a wireless network such as wireless fidelity (WiFi), and this may greatly extend usage scenarios of the wireless network, and facilitate people's life. When the wireless network terminal is not inserted, the extended base still has relatively large power consumption. To reduce the power consumption and prolong a service life of the extended base, power supplying needs to be stopped to disable the extended base.

An external power supply is used or a built-in power supply is enabled, to supply power to the extended base. Based on this, when the wireless network terminal is removed from the extended base, and power supplying to the extended base is stopped, the external power supply needs to be manually removed or a built-in power switch needs to be manually turned off. Therefore, operations are cumbersome, and user experience is relatively poor.

SUMMARY

Embodiments of the present disclosure provide an extended base of a mobile terminal and a power supply management method for the extended base. Power supplying to the extended base can be stopped without a manual operation when a wireless network terminal is removed, so as to improve usage experience.

Technical solutions used in the embodiments of the present disclosure are as follows.

A first aspect provides an extended base of a mobile terminal, where the extended base in the embodiments of the present disclosure includes a first connector, an enable circuit, a switch circuit, and a power supply, a metal shield is disposed on the first connector, and the metal shield is connected to the enable circuit; when the mobile terminal is inserted into the extended base, a second connector is in contact with the first connector, the metal shield is connected to the second connector for grounding, the enable circuit is electrically connected to the mobile terminal and generates an enable signal, and the switch circuit is connected to the enable circuit and outputs a voltage under control of the enable signal, so that under control of the voltage, the extended base enables the power supply to supply power, and when the mobile terminal is removed from the extended base, the second connector is out of contact with the first connector, the enable circuit is electrically disconnected from the mobile terminal and stops generating the enable signal, and the switch circuit stops outputting the voltage, so that under the control of the voltage, the extended base cannot enable the power supply to supply power.

With reference to the first aspect, in a first possible implementation manner, the switch circuit includes a first switch element, the first switch element includes a control end, a first connection end, and a second connection end, the control end is connected to the metal shield, the first connection end is connected to a power supply port VBUS pin of the extended base, and the second connection end is connected to the switch circuit; when the enable circuit is electrically connected to the mobile terminal, the control end is connected to the second connector for grounding, and the control end receives a high level signal from the mobile terminal, so that the first connection end and the second connection end are conducted, so that the enable signal is generated on the second connection end; and when the mobile terminal is removed from the extended base, the control end is free, so that the first connection end and the second connection end are disconnected, and the enable signal is not generated on the second connection end.

With reference to the first possible implementation manner of the first aspect, in a second possible implementation manner, the first switch element is a P-type field-effect MOS transistor, the control end of the first switch element is a gate electrode of the P-type field-effect MOS transistor, the first connection end of the first switch element is a source electrode of the P-type field-effect MOS transistor, and the second connection end of the first switch element is a drain electrode of the P-type field-effect MOS transistor.

With reference to the first possible implementation manner of the first aspect, in a third possible implementation manner, the switch circuit includes a second switch element, the second switch element includes a control end, a first connection end, and a second connection end, the control end of the second switch element is connected to the second connection end of the first switch element, the first connection end of the second switch element is connected to the power supply port VBUS pin of the extended base, and the second connection end of the second switch element is configured to selectively output the voltage; when the enable circuit is electrically connected to the mobile terminal, the control end of the second switch element receives the enable signal, so that the first connection end and the second connection end of the second switch element are conducted, and the second connection end of the second switch element outputs the voltage; and when the mobile terminal is removed from the extended base, the control end of the second switch element is free, so that the first connection end and the second connection end of the second switch element are disconnected, and the second connection end of the second switch element stops outputting the voltage.

With reference to the third possible implementation manner of the first aspect, in a fourth possible implementation manner, the second switch element is a P-type field-effect MOS transistor, the control end of the second switch element is a gate electrode of the P-type field-effect MOS transistor, the first connection end of the second switch element is a source electrode of the P-type field-effect MOS transistor, and the second connection end of the second switch element is a drain electrode of the P-type field-effect MOS transistor.

With reference to the third possible implementation manner of the first aspect, in a fifth possible implementation manner, the power supply circuit further includes an NPN transistor, a base of the NPN transistor is connected to the second connection end of the first switch element, an emitter of the NPN transistor is grounded, and a collector of the NPN transistor is connected to the control end of the second switch element.

A second aspect provides a power supply management method for an extended base of a mobile terminal, where the extended base includes a first connector, an enable circuit, a switch circuit, and a power supply, a metal shield that is connected to the enable circuit is disposed on the first connector, and the method in the embodiments of the present disclosure includes when the mobile terminal is inserted into the extended base, being, by a second connector of the mobile terminal, in contact with the first connector, connecting, by the metal shield, to the second connector for grounding, electrically connecting, by the enable circuit, to the mobile terminal and generating an enable signal, and connecting, by the switch circuit, to the enable circuit and outputting a voltage under control of the enable signal, so that under control of the voltage, the extended base enables the power supply to supply power; and when the mobile terminal is removed from the extended base, being, by the second connector, out of contact with the first connector, electrically disconnecting, by the enable circuit, from the mobile terminal and stopping generating the enable signal, and stopping, by the switch circuit, outputting the voltage, so that under the control of the voltage, the extended base cannot enable the power supply to supply power.

With reference to the second aspect, in a first possible implementation manner, the enable circuit includes a first switch element, the first switch element includes a control end, a first connection end, and a second connection end, the control end is connected to the metal shield, the first connection end is connected to a power supply port VBUS pin of the extended base, and the second connection end is coupled to the switch circuit; when the switch circuit is electrically connected to the mobile terminal, the control end is connected to the second connector for grounding, and the control end receives a high level signal from the mobile terminal, so that the first connection end and the second connection end are conducted, so that the enable signal is generated on the second connection end; and when the mobile terminal is removed from the extended base, the control end is free, so that the first connection end and the second connection end are disconnected, and the enable signal is not generated on the second connection end.

With reference to the first possible implementation manner of the second aspect, in a second possible implementation manner, the switch circuit includes a second switch element, the second switch element includes a control end, a first connection end, and a second connection end, the control end of the second switch element is connected to the second connection end of the first switch element, the first connection end of the second switch element is connected to the power supply port VBUS pin of the extended base, and the second connection end of the second switch element is configured to selectively output the voltage; when the enable circuit is electrically connected to the mobile terminal, the control end of the second switch element receives the enable signal, so that the first connection end and the second connection end of the second switch element are conducted, and the second connection end of the second switch element outputs the voltage; and when the mobile terminal is removed from the extended base, the control end of the second switch element is free, so that the first connection end and the second connection end of the second switch element are disconnected, and the second connection end of the second switch element stops outputting the voltage.

Beneficial effects of the embodiments of the present disclosure are as follows: when a mobile terminal is inserted into an extended base, a metal shield of a connector of the extended base is in contact with a connector of the mobile terminal, an enable circuit of the extended base is electrically connected to the mobile terminal and generates an enable signal, and a switch circuit outputs a voltage under control of the enable signal, so that under control of the voltage, the extended base enables a power supply to supply power; and when the mobile terminal is removed from the extended base, the enable circuit stops generating the enable signal, and the switch circuit stops outputting the voltage, so that power cannot be supplied to the extended base under the control of the voltage. Consequently, the extended base can be automatically powered on without a manual operation of a user according to inserting/removing of the mobile terminal such as a wireless network terminal, so as to improve usage experience.

BRIEF DESCRIPTION OF DRAWINGS

To describe the technical solutions in the embodiments of the present disclosure more clearly, the following briefly describes the accompanying drawings for describing the embodiments. The accompanying drawings in the following description show some embodiments of the present disclosure, and persons of ordinary skill in the art may still derive other drawings from these accompanying drawings without creative efforts.

DESCRIPTION OF EMBODIMENTS

To make the objectives, technical solutions, and advantages of embodiments of the present disclosure clearer, the following clearly and completely describes the technical solutions in the embodiments of the present disclosure with reference to the accompanying drawings in the embodiments of the present disclosure. The described embodiments are some but not all of the embodiments of the present disclosure. All other embodiments obtained by persons of ordinary skill in the art based on the embodiments of the present disclosure without creative efforts shall fall within the protection scope of the present disclosure.

Figure 1:
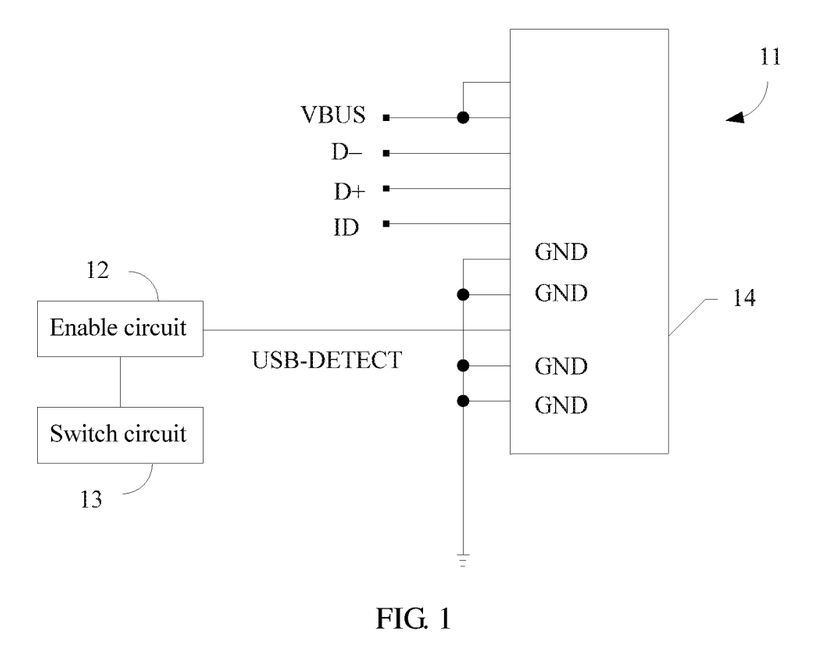
FIG. 1 is an equivalent schematic diagram of a circuit of an embodiment of an extended base according to the present disclosure.

An embodiment of the present disclosure provides an extended base that has a circuit structure shown in FIG. 1. A power supply and a power switch that controls the power supply to or not to supply power are built in or externally connected to the extended base. The power switch may be a switch whose on/off is controlled by using a voltage change. For example, the power switch is turned on when a voltage is greater than a first preset threshold, and the power switch is turned off when the voltage is less than a second preset threshold. The first preset threshold is greater than or equal to the second preset threshold. The voltage comes from a mobile terminal. That is, the mobile terminal outputs the voltage to the extended base when the mobile terminal is inserted into the extended base. The mobile terminal stops outputting the voltage to the extended base when the mobile terminal is removed from the extended base.

Insertion may be implemented between the mobile terminal and the extended base by using a physical structure. For example, a second connector whose type is a male connector is disposed on the mobile terminal and a first connector whose type is a female connector is disposed on the extended base; or a female connector is disposed on the mobile terminal and a male connector is disposed on the extended base. The mobile terminal in this embodiment of the present disclosure may be an access device of a wireless local area network (WLAN) such as WiFi. Correspondingly, the extended base may be configured to amplify signal strength of a wireless network or to provide more access nodes of the wireless network for a user. The following specification in the embodiments of the present disclosure is described by using this as an example, and certainly, is not limited herein.

As shown in FIG. 1, the extended base further includes a first connector 11, an enable circuit 12, and a switch circuit 13. The first connector 11 may be a male connector. A metal shield 14 is disposed on the first connector 11, and the metal shield 14 is connected to the enable circuit 12 by using a USB-DETECT pin. The enable circuit 12 is connected to the switch circuit 13. In the specification of the embodiments of the present disclosure, the term "connection" refers to a direct electrical connection or an indirect electrical connection. For example, a connection between the USB-DETECT pin and the enable circuit 12 and a connection between the enable circuit 12 and the switch circuit 13 may be a direct electrical connection or an indirect electrical connection by using another protection device.

Figure 2:
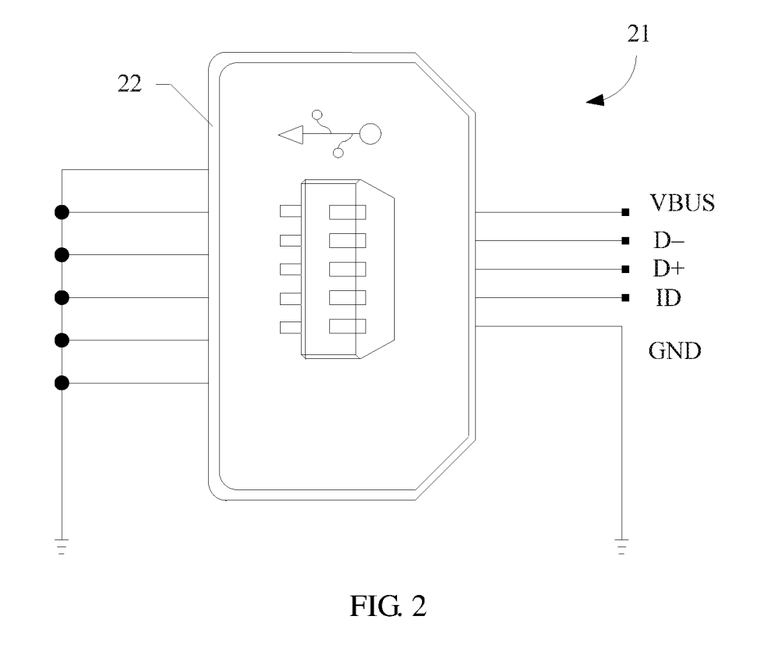
FIG. 2 is an equivalent schematic diagram of a circuit of an embodiment of a mobile terminal according to the present disclosure.

As shown in FIG. 2, a metal shield 22 and multiple interface pins are disposed on a second connector 21 of the mobile terminal. The second connector 21 may be a female connector. The second connector 21 has five pins, and in the five pins that the second connector 21 and the first connector 11 separately have, a power supply port VBUS pin is configured to be connected to a power supply of the mobile terminal, a D+ pin and a D− pin are configured to transmit data, an ID pin is configured to identify a type of a connected device, and a GND pin is configured to be grounded. The metal shield 22 is grounded by using multiple pins (for example, six pins shown in the figure). Based on this, the metal shield 22 and the GND pin are in a short-circuited state.

When the mobile terminal is inserted into the extended base, the second connector 21 is in contact with the first connector 11, and the metal shield 14 of the first connector 11 is in contact with the metal shield 22 of the second connector 21 and is grounded by using the metal shield 22. In this case, the enable circuit 12 of the extended base is electrically connected to the mobile terminal and generates an enable signal according to a detected electrical signal transferred by the mobile terminal, the switch circuit 13 outputs a voltage under control of the enable signal, the voltage is output by the power supply of the mobile terminal, and the power switch of the extended base is turned on under control of the voltage (which is greater than the first preset threshold), so that the power supply of the extended base automatically starts to supply power to the extended base.

When the mobile terminal is removed from the extended base, the second connector 21 is out of contact with the first connector 11, the metal shield 14 of the first connector 11 is out of contact with the metal shield 22 of the second connector 21, the enable circuit 12 is electrically disconnected from the mobile terminal and stops generating the enable signal, the switch circuit 13 stops outputting the voltage, and the power switch (where the voltage is less than the second preset threshold) of the extended base is turned off, so that under the control of the voltage, the extended base cannot enable the power supply to supply power.

It can be learned that compared with some approaches, in this embodiment of the present disclosure, when a mobile terminal is removed, an extended base can be automatically powered off and stop operating without a need to manually remove an external power supply of the extended base or to turn off a built-in power switch, and the extended base can be automatically powered on for operating when the mobile terminal is inserted, so that complexity of a manual operation of a user and man-machine interaction can be reduced, and user experience can be greatly improved.

Based on an operating principle and process of the foregoing enable circuit 12 and the switch circuit 13, the following describes circuit structures of the two to illustrate that this embodiment of the present disclosure is feasible.

Figure 3:
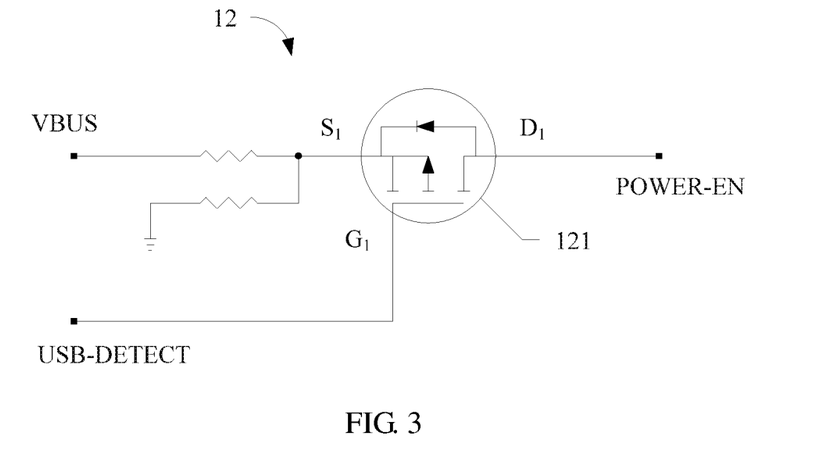
FIG. 3 is an equivalent schematic diagram of a circuit of an embodiment of an enable circuit shown in FIG. 1.

FIG. 3 is an equivalent schematic diagram of a circuit of a first embodiment of the enable circuit 12 shown in FIG. 1. As shown in FIG. 3, the enable circuit 12 includes a first switch element 121. The first switch element 121 includes a control end $G_1$, a first connection end $S_1$, and a second connection end $D_1$. The control end $G_1$ is connected to a USB-DETECT pin of the enable circuit 12, so as to connect to the metal shield 14 of the first connector 11 of the extended base. The first connection end $S_1$ is connected to a power supply port VBUS pin of the first connector 11 of the extended base. The second connection end $D_1$ is connected to a POWER-EN pin of the enable circuit 12, so as to connect to the switch circuit 13.

Figure 4:
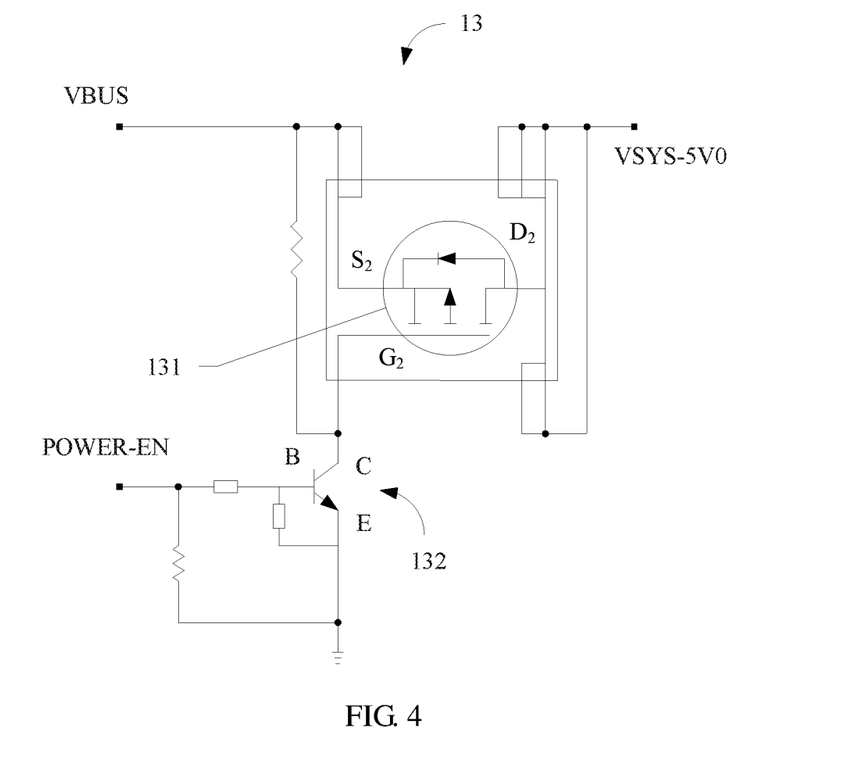
FIG. 4 is an equivalent schematic diagram of a circuit of a first embodiment of a switch circuit shown in FIG. 1.

FIG. 4 is an equivalent schematic diagram of a circuit of a first embodiment of the switch circuit 13 shown in FIG. 1. As shown in FIG. 4, the switch circuit 13 includes a second switch element 131 and an NPN transistor 132. The second switch element 131 includes a control end $G_2$, a first connection end $S_2$, and a second connection end $D_2$. A base (B) of the NPN transistor 132 is connected to a POWER-EN pin of the switch circuit 13, so as to connect to the second connection end $D_1$ of the first switch element 121. An emitter (E) of the NPN transistor 132 is grounded. A collector (C) of the NPN transistor 132 is connected to the control end $G_2$ of the second switch element 131. The first connection end $S_2$ of the second switch element 131 is connected to the power supply port VBUS pin of the extended base. The second connection end $D_2$ of the second switch element 131 is connected to a voltage output end, that is, a VSYS-5V0 pin, of the switch circuit 13, and is configured to selectively output the voltage that is used to control the power switch of the extended base.

With reference to FIG. 3 and FIG. 4, when the mobile terminal is inserted into the extended base, the enable circuit 12 is electrically connected to the mobile terminal, the control end $G_1$ of the first switch element 121 is grounded by using the second connector 21, and the control end $G_1$ of the first switch element 121 receives a high level signal from the mobile terminal, so that the first switch element 121 is conducted, that is, the first connection end $S_1$ and the second connection end $D_1$ of the first switch element 121 are connected, so that the enable signal is generated on the second connection end $D_1$ of the first switch element 121. The base B of the NPN transistor 132 is conducted after receiving the enable signal with a high level, that is, the emitter E and the collector C of the NPN transistor 132 are connected. The enable signal is transferred by the collector C to the control end $G_2$ of the second switch element 131. After the control end $G_2$ of the second switch element 131 receives the enable signal, the second switch element 131 is conducted, that is, the first connection end $S_2$ and the second connection end $D_2$ of the second switch element 131 are connected, and the second connection end $D_2$ of the second switch element 131 outputs the voltage. The power switch of the extended base is turned on when the voltage is greater than the first preset threshold, and the power supply automatically starts to supply power to the extended base.

When the mobile terminal is removed from the extended base, the control end $G_1$ of the first switch element 121 is free, so that the first switch element 121 is cut off, that is, the first connection end $S_1$ and the second connection end $D_1$ of the first switch element 121 are disconnected, and the enable signal is not generated on the second connection end $D_1$ of the first switch element 121; the control end $G_2$ of the second switch element 131 is free, so that the second switch element 131 is cut off, that is, the first connection end $S_2$ and the second connection end $D_2$ of the second switch element 131 are disconnected, and the second connection end of the second switch element 131 stops outputting the voltage. The power switch of the extended base is turned off when the voltage is less than the second preset threshold, and the power supply automatically stops supplying power to the extended base.

In this embodiment, the first switch element 121 may be a P-type field-effect MOS transistor, the control end $G_1$ of the first switch element 121 is a gate electrode of the P-type field-effect MOS transistor, the first connection end $S_1$ of the first switch element 121 is a source electrode of the P-type field-effect MOS transistor, and the second connection end $D_1$ of the first switch element 121 is a drain electrode of the P-type field-effect MOS transistor. Similarly, the second switch element 131 may be a P-type field-effect MOS transistor, the control end $G_2$ of the second switch element 131 is a gate electrode of the P-type field-effect MOS transistor, the first connection end $S_2$ of the second switch element 131 is a source electrode of the P-type field-effect MOS transistor, and the second connection end $D_2$ of the second switch element 131 is a drain electrode of the P-type field-effect MOS transistor.

A function of the NPN transistor 132 in this embodiment is to amplify the enable signal output by the first switch element 121, so as to ensure that the second switch element 131 can be conducted. Based on this, in another embodiment of the present disclosure, the NPN transistor 132 may not be disposed, that is, the control end $G_2$ of the second switch element 131 is directly connected to the second connection end $D_1$ of the first switch element 121.

It should be understood that the enable circuit 12 and the switch circuit 13 in this embodiment of the present disclosure may also have other circuit structures, for example, related structures such as a resistor and a capacitor that are respectively connected to the first switch element 121 and the second switch element 131 and are configured to protect the entire circuit structures.

Figure 5:
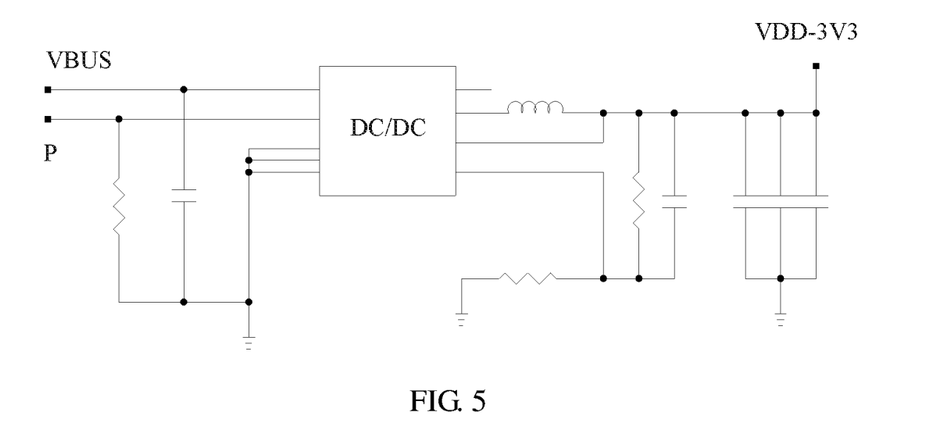
FIG. 5 is an equivalent schematic diagram of a circuit of a second embodiment of a switch circuit shown in FIG. 1.

The switch circuit 13 may be a DC/DC (Direct Current to Direct Current) chip shown in FIG. 5. Both an input end P and a power supply port VBUS pin of the DC/DC chip are connected to the second connection end $D_1$ of the first switch element 121, the input end P is configured to receive the enable signal (for example, 3 volts) output by the first switch element 121, and a voltage (for example, 3.3 volts) is output from an output end VDD-3V3. The circuit structure in this embodiment is simple and has a relatively low cost.

Figure 6:
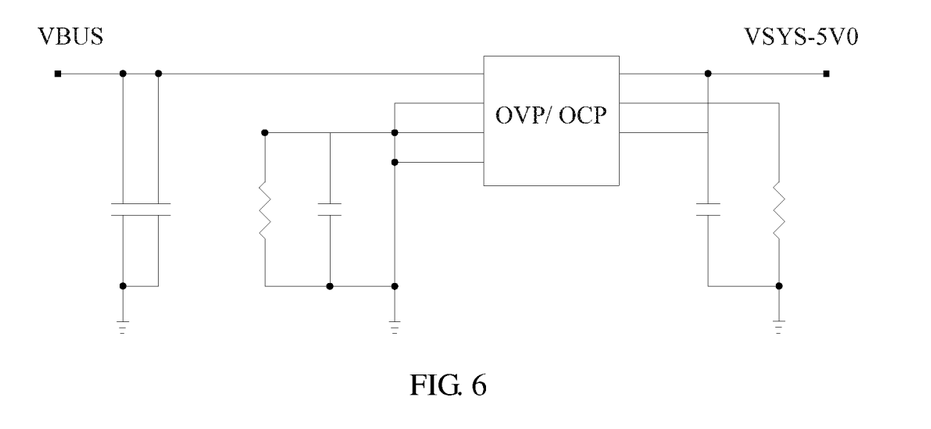
FIG. 6 is an equivalent schematic diagram of a circuit of a third embodiment of a switch circuit shown in FIG. 1.

The switch circuit 13 may be an overvoltage protection/over current protection (OVP/OCP) chip shown in FIG. 6. A power supply port VBUS pin of the OVP/OCP chip is connected to the second connection end $D_1$ of the first switch element 121, and is configured to receive the enable signal (for example, 3 volts) output by the first switch element 121, and output a voltage (for example, 5 volts) from an output end VSYS-5V0. This embodiment can deal with an abnormal case of a voltage/current in the entire circuit structure, to protect the entire circuit structure, and provide high security.

Figure 7:
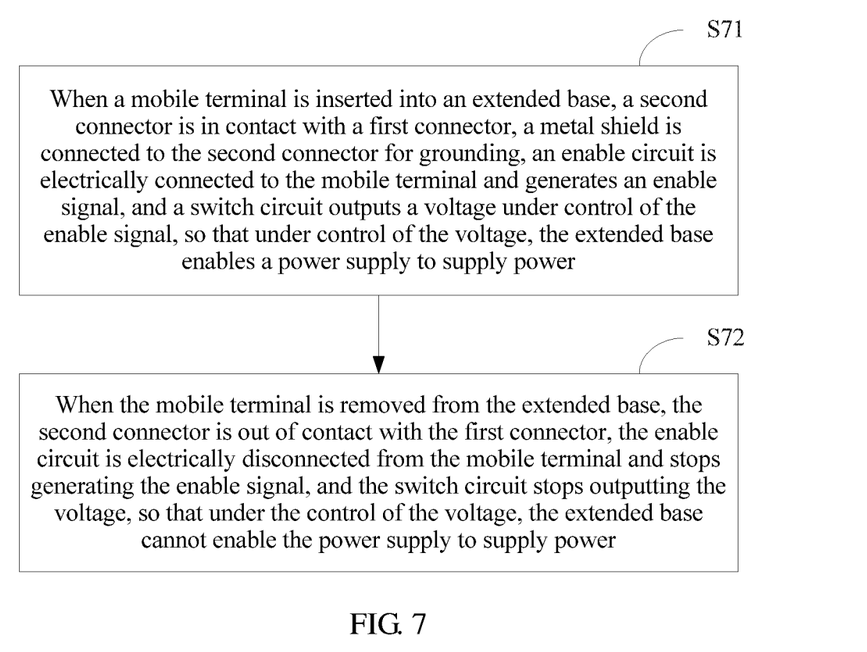
FIG. 7 is a schematic flowchart of an embodiment of a power supply management method for an extended base according to the present disclosure.

FIG. 7 is a schematic flowchart of an embodiment of a power supply management method for an extended base according to the present disclosure. The method is used to perform power supply management for the extended base in any one of the foregoing embodiments. The mobile terminal is inserted into the extended base and the extended base is used as a function extension device of the mobile terminal. A power supply and a power switch that controls the power supply to or not to supply power are built in or externally connected to the extended base. The extended base further includes a first connector, an enable circuit, and a switch circuit. The mobile terminal includes a grounded second connector. A metal shield that is connected to the enable circuit is disposed on the first connector. As shown in FIG. 7, the power supply management method in this embodiment includes the following steps.

Step S71: When the mobile terminal is inserted into the extended base, the second connector is in contact with the first connector, the metal shield is connected to the second connector for grounding, the enable circuit is electrically connected to the mobile terminal and generates an enable signal, and the switch circuit outputs a voltage under control of the enable signal, so that under control of the voltage, the extended base enables the power supply to supply power.

Step S72: When the mobile terminal is removed from the extended base, the second connector is out of contact with the first connector, the enable circuit is electrically disconnected from the mobile terminal and stops generating the enable signal, and the switch circuit stops outputting the voltage, so that under the control of the voltage, the extended base cannot enable the power supply to supply power.

The extended base in this embodiment may be an extended base that has the foregoing circuit structure, and the mobile terminal may be a mobile terminal that has the foregoing circuit structure. Therefore, for the power supply management method, refer to the operating principle and process of the foregoing extended base and the mobile terminal. Details are not described herein.

It is noted again that the foregoing descriptions are merely embodiments of the present disclosure, and the protection scope of the present disclosure is not limited thereto. All equivalent structure or equivalent procedure changes made by using the content of this specification and accompanying drawings in the present disclosure or by directly or indirectly applying the present disclosure in other related technical fields shall fall within the patent protection scope of the present disclosure.

What is claimed is:
1. An extended base of a mobile terminal, wherein the extended base comprises:

a first connector;
an enable circuit coupled to the first connector and comprising a first switch element that includes a control end, a first connection end, and a second connection end, wherein the first switch element is a first P-type field-effect metal oxide semiconductor (MOS) transistor, wherein the control end of the first switch element is a gate electrode of the first P-type field-effect MOS transistor, wherein the first connection end of the first switch element is a source electrode of the first P-type field-effect MOS transistor, and wherein the second connection end of the first switch element is a drain electrode of the first P-type field-effect MOS transistor;
a switch circuit coupled to the first connector and comprising a second switch element that includes a control end coupled to the second connection end of the first switch element, a first connection end coupled to a power supply input port VBUS pin of the extended base, and a second connection end configured to selectively output a voltage;
a power supply coupled to the first connector; and
a metal shield disposed on the first connector and coupled to the enable circuit,
wherein when the mobile terminal is inserted into the extended base, a second connector of the mobile terminal is in contact with the first connector, the metal shield is coupled to the second connector for grounding, the enable circuit is electrically coupled to the mobile terminal and is configured to generate an enable signal, and the switch circuit is coupled to the enable circuit and is configured to output the voltage responsive to the enable signal to cause the extended base to enable the power supply to supply power, and
wherein when the mobile terminal is removed from the extended base, the second connector is out of contact with the first connector, the enable circuit is electrically disconnected from the mobile terminal and is configured to stop generating the enable signal, and the switch circuit is configured to stop outputting the voltage to prevent the extended base from enabling the power supply to supply power.

2. The extended base of claim 1, wherein the control end of the first switch element is coupled to the metal shield, and the first connection end of the first switch element is coupled to a power supply port VBUS pin of the extended base,
wherein when the enable circuit is electrically coupled to the mobile terminal, the control end of the first switch element is coupled to the second connector for grounding and the control end of the first switch element receives a high level signal from the mobile terminal such that the first connection end of the first switch element and the second connection end of the first switch element are conducted and the enable signal is generated on the second connection end of the first switch element, and
wherein when the mobile terminal is removed from the extended base, the control end of the first switch element is free such that the first connection end of the first switch element and the second connection end of the first switch element are disconnected and the enable signal is not generated on the second connection end of the first switch element.

3. The extended base of claim 2,
wherein when the enable circuit is electrically coupled to the mobile terminal, the control end of the second switch element is configured to receive the enable signal such that the first connection end of the second switch element and the second connection end of the second switch element are electrically coupled and the second connection end of the second switch element outputs the voltage, and
wherein when the mobile terminal is removed from the extended base, the control end of the second switch element is free such that the first connection end of the second switch element and the second connection end of the second switch element are disconnected and the second connection end of the second switch element stops outputting the voltage.

4. The extended base of claim 3, wherein the second switch element is a second P-type field-effect metal oxide semiconductor (MOS) transistor, wherein the control end of the second switch element is a gate electrode of the second P-type field-effect MOS transistor, wherein the first connection end of the second switch element is a source electrode of the second P-type field-effect MOS transistor, and wherein the second connection end of the second switch element is a drain electrode of the second P-type field-effect MOS transistor.

5. The extended base of claim 3, wherein the switch circuit further comprises a negative-positive-negative (NPN) transistor, wherein a base of the NPN transistor is coupled to the second connection end of the first switch element, wherein an emitter of the NPN transistor is grounded, and wherein a collector of the NPN transistor is coupled to the control end of the second switch element.

6. The extended base of claim 1,
wherein when the enable circuit is electrically coupled to the mobile terminal, the control end of the second switch element receives the enable signal such that the first connection end of the second switch element and the second connection end of the second switch element are conducted and the second connection end of the second switch element outputs the voltage, and
wherein when the mobile terminal is removed from the extended base, the control end of the second switch element is free such that the first connection end of the second switch element and the second connection end of the second switch element are disconnected and the second connection end of the second switch element stops outputting the voltage.

7. The extended base of claim 4, wherein the switch circuit further comprises a negative-positive-negative NPN) transistor, wherein a base of the NPN transistor is connected to the second connection end of the first switch element, wherein an emitter of the NPN transistor is grounded, and wherein a collector of the NPN transistor is coupled to the control end of the second switch element.

8. The extended base of claim 1, wherein the switch circuit is an overvoltage protection chip.

9. The extended base of claim 8, wherein the overvoltage protection chip includes a power supply port coupled to the second connection end of the first switch element, and wherein the power supply port is configured to receive the enable signal.

10. The extended base of claim 9, wherein the overvoltage protection chip further includes an output end configured to output the voltage.

11. The extended base of claim 1, wherein the switch circuit is an over current protection chip.

12. The extended base of claim 11, wherein the over current protection chip includes a power supply port coupled to the second connection end of the first switch element, and wherein the power supply port is configured to receive the enable signal.

13. The extended base of claim 12, wherein the over current protection chip further includes an output end configured to output the voltage.

14. The extended base of claim 1, wherein the switch circuit is a direct current (DC) to DC chip.

15. The extended base of claim 14, wherein the DC to DC chip includes an input end and a power supply port, wherein the input end and the power supply port of the DC to DC chip are coupled to the second connection end of the first switch element.

16. The extended base of claim 15, wherein the input end is configured to receive the enable signal output by the first switch element.

17. The extended base of claim 16, wherein the DC to DC chip further includes an output end configured to output the voltage.

18. A power supply management method for a mobile terminal, the method comprising:
    providing an extended base comprising a first connector, an enable circuit, a switch circuit, a metal shield, and a power supply, wherein the metal shield is disposed on the first connector and is coupled to the enable circuit, wherein the first connector is coupled to the enable circuit, the switch circuit, and the power supply, wherein the enable circuit comprises a first switch element, wherein the first switch element comprises a P-type field effect metal oxide semiconductor (MOS), wherein the first switch element includes a control end, a first connection end, and a second connection end, wherein the control end of the first switch element is a gate electrode of the P-type field effect MOS, wherein the first connection end of the switch element is a source electrode of the P-type field effect MOS, wherein the second connection end of the switch element is a drain electrode of the P-type field effect MOS, and wherein the switch circuit comprises a second switch element that includes a control end coupled to the second connection end of the first switch element, a first connection end coupled to a power supply input port VBUS pin of the extended base, and a second connection end configured to selectively output a voltage;
    inserting the mobile terminal into the extended base, wherein when the mobile terminal is inserted in the extended base, a second connector of the mobile terminal is in contact with the first connector, the metal shield is coupled to the second connector for grounding, the enable circuit is electrically coupled to the mobile terminal and generates an enable signal, and the switch circuit is coupled to the enable circuit and outputs the voltage responsive to the enable signal to cause the extended base to enable the power supply to supply power; and
    removing the mobile terminal from the extended base, wherein when the mobile terminal is removed from the extended base, the second connector is out of contact with the first connector, the enable circuit is electrically disconnected from the mobile terminal and stops generating the enable signal, and the switch circuit stops outputting the voltage such that under the control of the voltage, the extended base prevents the power supply from supplying power.

19. The power supply management method claim 18, wherein providing the extended base comprises providing the a first switch element with:
    a control end coupled to the metal shield; and
    a first connection end coupled to a power supply input pert VBUS pin of the extended base,
    wherein when the enable circuit is electrically coupled to the mobile terminal, the control end of the first switch element is coupled to the second connecter for grounding and the control end of the first switch element receives a high level signal from the mobile terminal such that the first connection end of the first switch element and the second connection end of the first switch element are electrically coupled and the enable signal is generated on the second connection end of the first switch element, and
    wherein when the mobile terminal is removed from the extended base, the control end of the first switch element is free such that the first connection end of the first switch element and the second connection end of the first switch element are disconnected and the enable signal is not generated on the second connection end of the first switch element.

20. The power supply management method of claim 19, further comprising:
    when the enable circuit is electrically coupled to the mobile terminal, receiving the enable signal by the control end of the second switch element such that the first connection end and the second connection end of the second switch element are electrically coupled and the second connection end of the second switch element outputs the voltage; and
    when the mobile terminal is removed from the extended base, discontinue providing, by the second connection end of the first switch element, the enable signal tea the control end of the second switch element such that the first connection end and the second connection end of the second switch element are disconnected and the second connection end of the second switch element stops outputting the voltage.

* * * * *

UNITED STATES PATENT AND TRADEMARK OFFICE
CERTIFICATE OF CORRECTION

PATENT NO. : 10,488,903 B2
APPLICATION NO. : 15/560818
DATED : November 26, 2019
INVENTOR(S) : Huiyuan Wang and Chao Fu Page 1 of 1

It is certified that error appears in the above-identified patent and that said Letters Patent is hereby corrected as shown below:

In the Claims

Claim 4, Column 10, Line 19: "second switch." should read "second switch"

Claim 7, Column 10, Line 45: "negative-positive-negative NPN)" should read "negative-positive-negative (NPN)"

Claim 19, Column 12, Line 15: "input pert" should read "input port"

Claim 20, Column 12, Line 46: "signal tea the" should read "signal to the"

Signed and Sealed this
Seventh Day of January, 2020

Andrei Iancu
*Director of the United States Patent and Trademark Office*